(12) United States Patent
Meguro et al.

(10) Patent No.: US 8,664,697 B2
(45) Date of Patent: Mar. 4, 2014

(54) TRANSISTOR DEVICE

(75) Inventors: Takeshi Meguro, Kitaibaraki (JP); Jiro Wada, Hitachi (JP); Yoshihiko Moriya, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 13/543,041

(22) Filed: Jul. 6, 2012

(65) Prior Publication Data
US 2013/0009212 A1    Jan. 10, 2013

(30) Foreign Application Priority Data

Jul. 7, 2011  (JP) .................................. 2011-151108

(51) Int. Cl.
*H01L 29/66* (2006.01)
*H01L 21/331* (2006.01)

(52) U.S. Cl.
USPC ........... 257/194; 257/197; 257/577; 257/591; 257/592; 257/593; 257/E27.012; 257/E29.189; 257/E29.25; 438/312

(58) Field of Classification Search
USPC .......... 257/194, 197, 577, 591–593, E27.012, 257/E29.189, E29.25; 438/312
See application file for complete search history.

(56) References Cited

U.S. PATENT DOCUMENTS

| | | | |
|---|---|---|---|
| 7,700,423 B2 | 4/2010 | Cooke | |
| 2007/0278523 A1* | 12/2007 | Lin et al. | 257/194 |
| 2008/0023725 A1 | 1/2008 | Cooke et al. | |
| 2012/0175681 A1* | 7/2012 | Stevens et al. | 257/195 |

FOREIGN PATENT DOCUMENTS

| | | |
|---|---|---|
| JP | 3439578 B2 | 8/2003 |
| JP | 2008-60554 A | 3/2008 |
| JP | 2010-263018 A | 11/2010 |

* cited by examiner

Primary Examiner — Michelle Mandala
(74) Attorney, Agent, or Firm — Fleit Gibbons Gutman Bongini & Bianco PL; Marty Fleit; Paul D. Bianco

(57) ABSTRACT

To provide a transistor device, which is composed of a compound semiconductor, having a multilayer structure in which a high electron mobility transistor (HEMT) and a heterojunction bipolar transistor (HBT) are overlapped on the same substrate and epitaxial-grown thereon, wherein a band gap energy of an indium gallium phosphide layer (InGaP) included in an epitaxial layer, is set to 1.91 eV or more.

20 Claims, 3 Drawing Sheets

FIG.1

| | | |
|---|---|---|
| n-type $In_xGa_{(1-x)}$As (0<x<1) | NON-ALLOY CONTACT LAYER | 46 |
| n-type GaAs | EMITTER CONTACT LAYER | 45 |
| n-type InGaP | EMITTER LAYER | 44 |
| p-type GaAs | BASE LAYER | 43 |
| n-type GaAs | COLLECTOR LAYER | 42 |
| n-type GaAs | SUB-COLLECTOR LAYER | 41 |
| $In_{(1-y)}Ga_yP$ (0<y<1) | SEPARATION LAYER | 40 |
| n-type GaAs | CONTACT LAYER | 39 |
| $Al_xGa_{(1-x)}$As (0<x<1) | SHOTTKY LAYER | 38 |
| n-type $Al_xGa_{(1-x)}$As (0<x<1) | CARRIER SUPPLYING LAYER | 37 |
| $Al_xGa_{(1-x)}$As (0<x<1) | SPACER LAYER | 36 |
| $In_xGa_{(1-x)}$As (0<x<1) | CHANNEL LAYER | 35 |
| $Al_xGa_{(1-x)}$As (0<x<1) | SPACER LAYER | 34 |
| n-type $Al_xGa_{(1-x)}$As (0<x<1) | CARRIER SUPPLYING LAYER | 33 |
| AlGaAs | BUFFER LAYER | 32b |
| GaAs | BUFFER LAYER | 32a |
| GaAs | SEMI-INSULATING SUBSTRATE | 31 |

| | | |
|---|---|---|
| n-type $In_xGa_{(1-x)}$As (0<x<1) | NON-ALLOY CONTACT LAYER | 46 |
| n-type GaAs | EMITTER CONTACT LAYER | 45 |
| n-type $In_{(1-y)}Ga_yP$ (0<y<1) | EMITTER LAYER | 48 |
| p-type GaAs | BASE LAYER | 43 |
| n-type GaAs | COLLECTOR LAYER | 42 |
| n-type GaAs | SUB-COLLECTOR LAYER | 41 |
| InGaP | SEPARATION LAYER | 47 |
| n-type GaAs | CONTACT LAYER | 39 |
| $Al_xGa_{(1-x)}$As (0<x<1) | SHOTTKY LAYER | 38 |
| n-type $Al_xGa_{(1-x)}$As (0<x<1) | CARRIER SUPPLYING LAYER | 37 |
| $Al_xGa_{(1-x)}$As (0<x<1) | SPACER LAYER | 36 |
| $In_xGa_{(1-x)}$As (0<x<1) | CHANNEL LAYER | 35 |
| $Al_xGa_{(1-x)}$As (0<x<1) | SPACER LAYER | 34 |
| n-type $Al_xGa_{(1-x)}$As (0<x<1) | CARRIER SUPPLYING LAYER | 33 |
| AlGaAs | BUFFER LAYER | 32b |
| GaAs | BUFFER LAYER | 32a |
| GaAs | SEMI-INSULATING SUBSTRATE | 31 |

| | | |
|---|---|---|
| n-type $In_xGa_{(1-x)}$ As (0<x<1) | NON-ALLOY CONTACT LAYER | 46 |
| n-type GaAs | EMITTER CONTACT LAYER | 45 |
| n-type $In_{(1-y)}Ga_yP$ (0<y<1) | EMITTER LAYER | 48 |
| p-type GaAs | BASE LAYER | 43 |
| n-type GaAs | COLLECTOR LAYER | 42 |
| n-type GaAs | SUB-COLLECTOR LAYER | 41 |
| $In_{(1-y)}Ga_yP$ (0<y<1) | SEPARATION LAYER | 40 |
| n-type GaAs | CONTACT LAYER | 39 |
| $Al_xGa_{(1-x)}$ As (0<x<1) | SHOTTKY LAYER | 38 |
| n-type $Al_xGa_{(1-x)}$ As (0<x<1) | CARRIER SUPPLYING LAYER | 37 |
| $Al_xGa_{(1-x)}$ As (0<x<1) | SPACER LAYER | 36 |
| $In_xGa_{(1-x)}$ As (0<x<1) | CHANNEL LAYER | 35 |
| $Al_xGa_{(1-x)}$ As (0<x<1) | SPACER LAYER | 34 |
| n-type $Al_xGa_{(1-x)}$ As (0<x<1) | CARRIER SUPPLYING LAYER | 33 |
| AlGaAs | BUFFER LAYER | 32b |
| GaAs | BUFFER LAYER | 32a |
| GaAs | SEMI-INSULATING SUBSTRATE | 31 |

Layer group 52: 46, 45, 48, 43, 42, 41
Layer group 51: 39, 38, 37, 36, 35, 34, 33
Stack 50

FIG.4

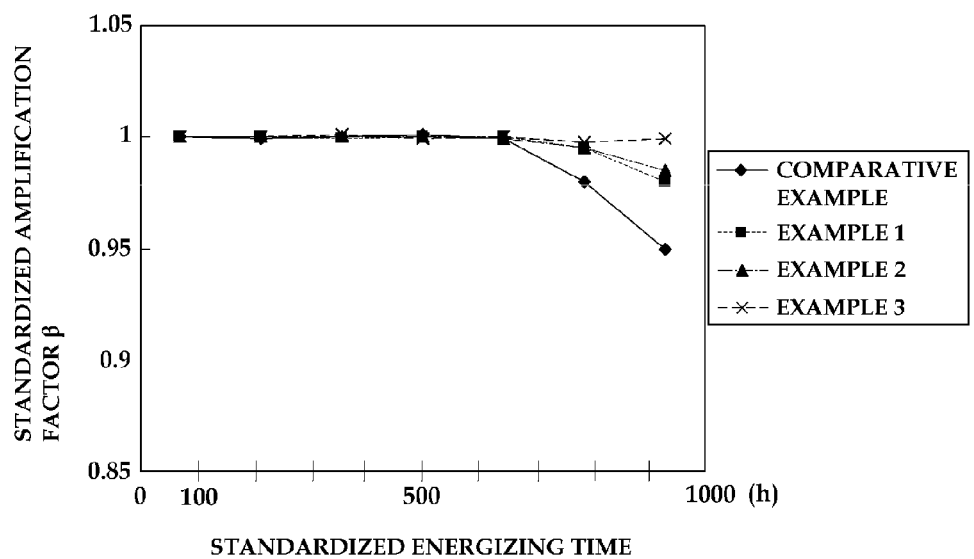

TRANSISTOR DEVICE

The present application is based on Japanese Patent Application No. 2011-151108, filed on Jul. 7, 2011, the entire contents of which are hereby incorporated by reference.

TECHNICAL FIELD

The present invention relates to a transistor device, and more particularly to the transistor device suitable for a power amplifier for a high frequency device composed of a compound semiconductor.

DESCRIPTION OF RELATED ART

A heterojunction bipolar transistor (HBT) applied to a power amplifier (PA) for high frequency device achieves an ultra-fast operation with low distortion, and is used for a transmission part mainly such as a portable telephone terminal and wireless LAN. A structure in which a high electron mobility transistor (HEMT) is added to HBT, is called BiHEMT. Owing to the BiHEMT, a part of a peripheral circuit of HBT can be integrated to be 1 chip. The BiHEMT has an advantage that miniaturization of a module and shortening of a transmission path can be realized, thereby improving the characteristic of the module.

BiHEMT epitaxial wafer is formed by mounting HEMT structure on a compound semiconductor substrate, and mounting HBT structure thereon. A high resistance buffer layer with high performance is required for HEMT structure. From an aspect of securing the characteristic of the high resistance buffer layer, generally HEMT structure is arranged on a lower side (substrate side), and HBT structure is arranged on an upper side in many cases (see patent documents 1, 2, 3). However, although being a rare case, there is also a case that HBT structure is arranged on the lower side and HEMT structure is arranged on the upper side reversely (see patent document 1). However, in this case, the high resistance buffer layer required for HEMT structure, needs to be grown considerably thick, thus posing a demerit in terms of a cost.

The structure and material of HEMT and HBT in BiHEMT, is basically the same as a conventional single body, wherein HBT single body is simply stacked on HEMT single body. InGaP layer which can be easily selectively etched, and aluminum arsenide (AlAs) layer which is slightly low in selectivity but can be easily grown, are used as a separation layer for separating HEMT structure from HBT structure. Both the stacked HBT and HEMT can't be used simultaneously at the same place, and exclusive use of using only one of them is possible if a wiring pattern and an electrode part are removed.

A basic structure of the BiHEMT epitaxial wafer will be described using FIG. 5. HEMT structure 51 is a stacked structure comprising:
 a buffer layer 2 for preventing a current leak and relaxing a strain;
 a carrier supplying layer 3 for supplying electrons;
 an electron-transmitting layer (channel layer) 4 for transmitting electrons;
 a carrier supplying layer 5 for supplying electrons;
 a schottky layer 6 for having a withstand voltage in contact with a schottky electrode; and
 a contact layer 7 doped with n-type carrier with high concentration, for reducing a contact resistance with metal being an electrode,
 which are stacked sequentially on a compound semiconductor substrate 1.

A separation layer (InGaP or AlAs) 8 for separating a HEMT structure 51 from a HBT structure 52, is stacked thereon.

The HBT structure 52 is a stacked structure comprising:
 a sub-collector layer 9 for extracting current to outside
 a collector layer 10 for collecting electrons;
 a base layer 11 for controlling a flow of the electrons;
 an emitter layer 12 for emitting the electrons; and
 an emitter contact layer 13 for injecting the current from the outside,
 which are stacked sequentially on the separation layer 8.

Such a thin film multilayer structure can be formed by a method such as Metal Organic Vapor Phase Epitaxy MOVPE), Metal Organic Chemical Vapor Deposition (MOCVD), and Metal Beam Epitaxy (MBE).

MOVPE is a method of gasifying and supplying an organic metal raw material in a solid state or a liquid state, then thermal decomposing it on a substrate with a temperature raised, to cause a chemical reaction, so that a thin film crystal is epitaxial-grown thereon. MBE is a method of evaporating compositional elements of a crystal from a separate crucible individually in a ultra-vacuum state, which is then supplied onto a temperature-raised substrate in a form of a molecular beam, so that the thin film crystal is epitaxial-grown thereon. However, a high vacuum state is required for the MBE method, and therefore a weak point of the MBE method is that phosphorus epitaxial growth with high steam pressure is difficult. Therefore, in a case of the BiHEMT, growth is progressed by exclusively the MOVPE method. By these methods, an epitaxial wafer having the thin film multiplayer structure in which crystal growth is caused on the compound semiconductor substrate, is completed, and a process is advanced to pattern formation, etching, electrode formation, protective film formation, and packaging, etc., to thereby complete a device using BiHEMT.

FIG. 6 shows a cross-sectional view schematically showing a BiHEMT device that has undergone the process. The device is composed of a semi-insulating compound semiconductor substrate 20, HEMT part 21, HBT part 22, source electrode 23 of HEMT, gate electrode 24, drain electrode 25, emitter electrode 26 of HBT, base electrode 27, collector electrode 28, insulating area 29, etc. As described above, in a case of a general BiHEMT, HEMT part 21 occupies a lower half of the device, and HBT part 22 occupies an upper half. Further, generally, HBT part 22 being a power amplifier, has a large area, and HEMT part 21 used for the peripheral circuit such as a bias circuit has a small area. Note that the insulating area 29 is formed as needed, and there is a method of forming the insulating area 29 by implanting ions to obtain high resistance or recessing a trench.

Patent document 1:
Patent Publication No. 3439578
Patent document 2:
Japanese Patent Laid Open Publication No. 2010-263018
Patent document 3:
Japanese Patent Laid Open Publication No. 2008-60554

As described above, the BiHEMT device is expected to improve electric characteristic by miniaturizing the module and reducing a transmission loss, for the module manufactured by combining a conventional HEMT device and HBT device. However, as a result of a reliability test, it is found that there is a problem that the characteristic of the BiHEMT device is easily deteriorated, because the characteristic requested for a communication of the next generation (LTE, A-LTE) is extremely strict.

SUMMARY OF THE INVENTION

An object of the present invention is to provide a transistor device having an equivalent reliability to the reliability of a HBT device having a single body structure.

According to an aspect of the present invention, there is provided a transistor device composed of a compound semiconductor, having a multilayer structure in which a high electron mobility transistor (HEMT) and a heterojunction bipolar transistor (HBT) are overlapped on the same substrate and epitaxial-grown thereon, wherein a band gap energy of an indium gallium phosphide layer (InGaP) included therein as an epitaxial layer, is set to 1.91 eV or more.

The InGaP layer included in the epitaxial layer, is preferably the separation layer for separating HEMT from HBT, and is preferably the emitter layer of HBT, or is preferably the separation layer for separating HEMT from HBT, and the emitter layer of HBT.

The compound semiconductor is preferably one or more compounds selected from a group consisting of GaAs, AlGaAs, InGaAs, InGaP, and InAlGaP.

The n-type impurity doped into the compound semiconductor is preferably one or more elements selected from a group consisting of Si, Sn, S, Se, and Te.

The p-type impurity doped into the compound semiconductor is preferably C (carbon).

A lattice mismatch degree between the InGaP layer and the GaAs layer included in the epitaxial layer, is preferably within ±500 s and further preferably within ±200 s in an X-ray analysis measurement.

According to the present invention, an equivalent reliability to the reliability of a HBT device having a single structure can be realized.

BRIEF DESCRIPTION OF THE DRAWINGS

FIG. 1 is a block diagram of an epitaxial wafer of a transistor device according to example 1 of the present invention.

FIG. 2 is a block diagram of an epitaxial wafer of a transistor device according to example 2 of the present invention.

FIG. 3 is a block diagram of an epitaxial wafer of a transistor device according to example 3 of the present invention.

FIG. 4 is a view showing a comparison result of a reliability test of a HBT part that constitutes BiHEMT according to this example and a comparison example.

Figure 5:
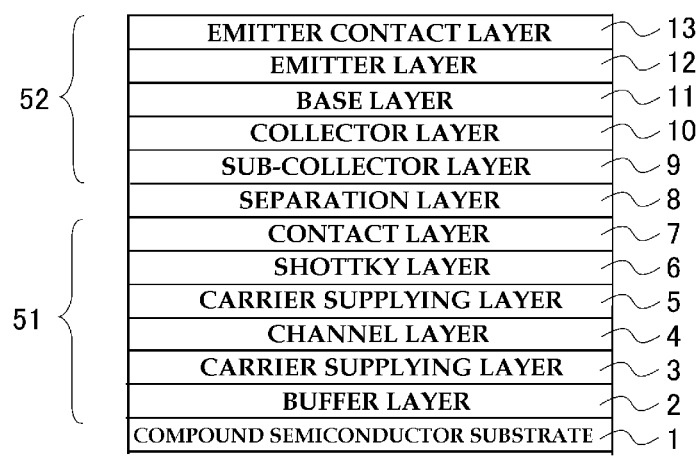
FIG. 5 is a basic block diagram of a conventional epitaxial wafer of a transistor device.

DETAILED DESCRIPTION OF THE INVENTION (Outline of the Invention)

As described above, the HBT device constituting the BiHEMT device has a problem that it is more easily deteriorated than the HBT device having a single body structure. As a cause thereof, it is found that there is a problem in the characteristic of InGap included in BiHEMT. As a large point of improving the characteristic of InGaP, an InGaP layer is grown at a low temperature.

However, there is a considerable difference in an actually used growth condition for causing the growth at a low temperature, depending on a difference in the structure of a furnace and an arrangement of a heater and a difference in each required condition such as a growth pressure. Therefore, it is difficult to define the growth only by temperature.

Therefore, as a result of a strenuous effort by inventors of the present invention by focusing on not the temperature but the band gap energy of InGaP, it is found that the reliability of a HBT part of the BiHEMT can be improved even if the structure of the furnace and the arrangement of the heater and each required condition such as the growth pressure are different as described above, although an influence of a distribution, etc., remains. The present invention is provided based on such knowledge.

According to an aspect of the present invention, there is provided a transistor device composed of a compound semiconductor, having a multilayer structure in which a high electron mobility transistor (HEMT) and a heterojunction bipolar transistor (HBT) are overlapped on the same substrate and epitaxial-grown thereon, wherein a band gap energy of an indium gallium phosphide layer (InGaP) included therein as an epitaxial layer, is set to 1.91 eV or more. The band gap energy of a semiconductor has a tendency of decreasing by increase of the temperature. Therefore, the band gap energy of the InGaP layer included in the epitaxial layer, is set to 1.91 eV or more, so that the InGaP layer can be grown at a low temperature and the reliability of HBT in the transistor device can be improved. It is especially preferable that the band gap energy is set to 1.91 eV to 1.92 eV.

In some of the embodiments, the InGaP layer may be the separation layer, the emitter layer, or the separation layer and the emitter layer in which the band gap energy is set to 1.91 eV or more. This is a combination capable of obtaining a high effect in improving the reliability of HBT.

Also, in some of the embodiments, the compound semiconductor may be one or more compounds selected from a group consisting of GaAs, AlGaAs, InGaP and InAlGaP. This is a combination of the compound semiconductor capable of obtaining a high effect in improving the reliability of HBT. According to a concept of the embodiment, even in a case of the InP system, probably there is a combination capable of obtaining a similar effect. However, the growth in this case is difficult.

First Embodiment

In the epitaxial wafer for a transistor device according to a first embodiment shown in FIG. 1, the InGaP layer included in the epitaxial layer is the separation layer.

As shown in FIG. 1, the epitaxial wafer 50 for a transistor device has a BiHEMT structure in which the HEMT structure 51 is formed on the semi-insulating substrate 31 composed of GaAs, and the HBT structure 52 is formed on the HEMT structure 51 through the separation layer 40 composed of $In_{(1-y)}Ga_yP$ layer ($0<y<1$).

The HEMT structure 51 is formed by sequentially stacking.

GaAs layer 32a and AlGaAs layer 32b being a buffer layer of two layers;
n-type $Al_xGa_{(1-x)}As$ layer ($0<x<1$) being a carrier supplying layer 33;
$Al_xGa_{(1-x)}As$ layer ($0<x<1$) being a spacer layer 34;
$In_xGa_{(1-x)}As$ layer ($0<x<1$) being a channel layer 35;
$Al_xGa_{(1-x)}As$ layer ($0<x<1$) being a space layer 36;
n-type $Al_xGa_{(1-x)}As$ layer ($0<x<1$) being a carrier supplying layer 37;
$Al_xGa_{(1-x)}As$ layer ($0<x<1$) being a Schottky layer 38; and
n-type GaAs layer being a contact layer 39.

The HBT structure 52 is formed by sequentially stacking:
n-type GaAs layer being a sub-collector layer 41;
n-type GaAs layer being a collector layer 42;
p-type GaAs layer being a base layer 43;

n-type InGaP layer being an emitter layer 44;
n-type GaAs layer being an emitter contact layer 45; and
n-type In$_x$Ga$_{(1-x)}$As layer (0<x<1) being a non-alloy contact layer 46.

The separation layer 40 composed of In$_{(1-y)}$Ga$_y$P layer (0<x<1) for separating the HEMT structure 51 from the HBT structure 52, has a structure in which the band gap energy is set to 1.91 eV or more. The separation layer 40 is also a stopper layer capable of selectively etching the HTB structure 52 up to the separation layer 40.

The band gap energy of the In$_{(1-y)}$Ga$_y$P layer formed on the GaAs layer (contact layer 39) is varied depending on Ga composition y. The band gap energy thereof is about 1.91 eV when the Ga composition y is about 0.515. When the Ga composition is larger than 0.515, the band gap energy becomes larger than 1.91 eV. Meanwhile, when the Ga composition y is smaller than 0.515, the band gap energy becomes smaller than 1.91 eV.

Accordingly, in order to set the band gap energy of In$_{(1-y)}$Ga$_y$P to 1.91 eV or more, the Ga composition y may be set to larger than 0.515. Further, there is a tendency that the band gap energy is decreased by increase of the growth temperature, and therefore the band gap energy can be increased by decreasing the growth temperature of the InGaP layer.

By setting the band gap energy of the InGaP layer included in BiHEMT to 1.91 eV or more, the reliability of HBT in BiHEMT can be improved. Although various reasons can be considered, one of the large points is that the InGaP is grown at a low temperature (350° C. or more, 550° C. or less is suitable).

The effects of growing the InGaP at a low temperature, are as follows:
(a) reduction of a transition layer on an interface of InGaP/GaAs,
(b) reduction of an amount of take-in of impurities into InGaP,
(c) suppression of heat generation by limit of a base current due to large difference in the band gap energy (ΔEv) of a valence band, when InGaP is used for the emitter layer.

Each of the aforementioned effects will be described hereafter in detail.
(a) The transition layer on the InGaP/GaAs interface becomes a resistance component in a device, or includes a plurality of defects, thus easily causing a recombination, resulting in reduction of the reliability by heat generation, etc. Further, in an etching process, the transition layer remains unsatisfactorily, thereby causing the increase of the resistance component immediately under the electrode, and the increase of a surface current, resulting in reduction of the reliability in the same way. Accordingly, the reliability of HBT is improved by reducing the transition layer on the InGaP/GaAs interface.
(b) Regarding the take-in of the impurities into InGaP, arsenic (As) is mainly taken into consideration. Such a take-in of the impurities causes formation of a deep order or a lattice strain due to compositional shift, thereby generating increase of recombined current, and causing reduction of the reliability to occur. Accordingly, the reliability of HBT is improved by reducing the take-in of the impurities into InGaP.
(c) Regarding the base current limit due to large ΔEv, although depending on a substance, in a case of InGaP, when the band gap is widened by disordering, ΔEv is likely to be large in a hetero interface of GaAs. The base current is likely to be further limited if InGaP is used for the emitter layer of HBT, and therefore total current (mainly Ie) can be reduced. As a result, the heat generation is likely to be suppressed, thereby contributing to the improvement of the reliability. Accordingly, the reliability of HBT is improved by suppressing the heat generation by limiting the base current due to large ΔEv.

Accordingly, from the aforementioned (a) and (b), it can be said that by setting the band gap energy of InGaP to 1.91 eV or more, the separation layer 40 employed by this embodiment is one of the places that contributes to the improvement of the reliability of HBT. A combination capable of obtaining a highest effect can be obtained by forming the separation layer 40 and the emitter layer 44 by InGaP with the band gap energy of 1.91 eV or more.

Further, in some of the embodiments, a lattice mismatch degree between InGaP and GaAs is preferably defined. When the band gap energy of InGaP is large, the lattice mismatch degree between the InGaP layer (separation layer 40) and the GaAs layer (contact layer 39) becomes large. When the lattice mismatch degree becomes large, the resistance component is generated due to crystal strain, thus increasing the recombined current due to the generation of defect, and the reliability is affected thereby and the effect of the embodiment can't be obtained even if the band gap energy of InGaP can be set to 1.91 eV or more. In the X-ray analysis measurement, the lattice mismatch degree between the InGaP layer (separation layer 40) and the GaAs layer (contact layer 39) needs to be within ±500 s at minimum, and within ±200 s in which the effect of this embodiment can be sufficiently obtained. Wherein, s indicates seconds being a unit of an angle.

One or more elements selected from a group consisting of silicon (Si), tin (Sn), sulfur (S), selenium (Se), and tellurium (Te) can be used as n-type impurity taken-in to the epitaxial layer. In this embodiment, although not depending on the kind of n-type dopant basically, at least the aforementioned kinds are examined.

Further, carbon (C) is preferable as p-type impurity taken-in to the epitaxial layer. When the carbon is used for p-type dopant, the effect of this embodiment is high. Doping into p-type base layer of HBT can be given as an example. However, if dopant excluding carbon, for example zinc (Zn), etc., is used, zinc itself causes a thermal diffusion or abnormal diffusion due to electric field, thus masking the effect of this embodiment.

According to this embodiment, one or more effects given below can be exhibited.
(1) When the band gap energy of the InGaP layer included in BiHEMT is set to 1.91 eV or more, the reliability of HBT in BiHEMT is improved, and the equivalent characteristic to the characteristic of HBT epitaxial wafer having a single structure can be exhibited.
(2) Particularly, when the InGaP layer with the band gap energy of 1.91 eV or more is used for the separation layer for separating HEMT from HBT in BiHEMT, a great effect of improving the reliability of HBT can be obtained from the above-described reasons (a) and (b).
(3) When the compound semiconductor constituting BiHEMT is one or more compounds selected from a group consisting of GaAs, AlGaAs, InGaAs, InGaP and InAlGaP, a highest effect can be obtained.
(4) When the lattice mismatch degree between the InGaP layer and the GaAs layer included in the epitaxial layer, is within ±500 s or preferably ±200 s in the X-ray analysis measurement, the influence on the reliability is small, and therefore the effect of this embodiment can be sufficiently obtained.
(5) The BiHEMT epitaxial wafer of this embodiment can exhibit the equivalent characteristic to the characteristic of the HBT epitaxial wafer having a single structure in the reliability test, thus realizing the epitaxial wafer for a power amplifier for the next generation communication capable of realizing both miniaturization and high reliability. Accordingly, in the BiHEMT device of this embodiment as well, the equivalent characteristic to the characteristic of the HBT device having a single body structure can be exhibited, and therefore the epitaxial wafer for a power amplifier for the next generation communication capable of realizing both miniaturization and high reliability, can be provided.

Second Embodiment

In the epitaxial wafer for a transistor device according to a second embodiment shown in FIG. 2, the InGaP layer included in the epitaxial layer, is an emitter layer. An emitter layer 48 is formed of $In_{(1-y)}Ga_yP$ layer (0<y<1) with the band gap energy of 1.91 eV or more, and a separation layer 47 is formed of the InGaP layer with the band gap energy of less than 1.91 eV similarly to the conventional example. Thus, even if the InGaP layer with the band gap energy of 1.91 eV or more is used for the emitter layer 48 of HBT in BiHEMT, the high effect can be obtained similarly to the first embodiment, owing to the above-described effect of c).

Third Embodiment

In the epitaxial wafer for a transistor device according to a third embodiment shown in FIG. 3, the InGaP layer included in the epitaxial layer is the separation layer and the emitter layer. Not only the separation layer 40 but also the emitter layer 48 is formed of the $In_{(1-y)}Ga_yP$ layer (0<y<1) with the band gap energy of 1.91 eV or more. The other structure is the same as the structure of the first embodiment. Thus, when the InGaP layer with the band gap energy of 1.91 eV or more is used for the separation layer 40 of HEMT and HBT in BiHEMT and the emitter layer 48 of HBT, further greater effect than the effect of the first embodiment can be obtained from the above-described reasons (a) to (c).

MODIFIED EXAMPLE

The present invention is not limited to the above-described examples, and various modifications are possible by a person skilled in the art in this technical field, within a technical concept of the present invention.

The aforementioned embodiments describe a case that the InGaP layer is applied to the separation layer 40 separating HBT from HEMT in BiHEMT, and a case that the InGaP layer is applied to the InGaP emitter layer 48 of HBT. However, even in a case that the InGaP layer is applied to the other layer, although an exact effect as the effect of the aforementioned layer is not obtained, a similar effect can be obtained, for example in a case that the InGaP layer of the present invention is applied to the layer for separating the substrate 31 from an epitaxial part, and the epitaxial layer used for selective etching for exposing agate layer of HEMT part, and selective etching for exposing a collector layer of HBT.

Further, according to this embodiment, a double doping structure with the channel layer (electron transmitting layer) 35 interposed between the carrier supplying layers 33 and 37 is employed in the structure of the HEMT part. However, the similar effect can be obtained even if the structure is replaced with a structure of only one carrier supplying layer, namely a single dope structure.

Further, according to this embodiment, a general epitaxial structure in which a doping layer has a prescribed thickness, is employed in the carrier supplying layer of the HEMT part.

However, the similar effect can be obtained even if intentionally using a planar doping layer in which the doping layer does not have a prescribed thickness.

Further, according to this embodiment, the buffer layer of the HEMT part is formed of the combination of single layers of AlGaAs32b/GaAs32a. However, the similar effect can be obtained even in a case of a more advanced structure such as a super lattice structure in which $Al_xGa_{(1-x)}As$ (0<x<1)/GaAS are periodically stacked, and in a buffer structure including a single layer or a multilayer $Al_xGa_{(1-x)}As$ (0<x<1), particularly in a case that a part or the whole part of the layer is doped with oxygen.

EXAMPLES

Example 1

The epitaxial wafer for a transistor device shown in FIG. 1 was manufactured. In a method of manufacturing the same, first, group III source gas, group V source gas, dopant source gas, etc., were supplied onto the semi-insulating substrate 31, for forming the HEMT structure 51. Then, on the semi-insulating substrate 31, GaAs buffer layer 32a was epitaxial-grown by 500 nm;

AlGaAs buffer layer 32b was epitaxial-grown by 50 nm;

$Al_xGa_{(1-x)}As$ (x=0.3) carrier supplying layer 33 doped with Si to n-type, was epitaxial-grown by 30 nm;

$Al_xGa_{(1-x)}As$ (x=0.3) space layer 34 was epitaxial-grown by 10 nm;

$In_xGa_{(1-x)}As$ (x=0.18) channel layer 35 was epitaxial-grown by 15 nm;

$Al_xGa_{(1-x)}As$ (x=0.3) spacer layer 36 was epitaxial-grown by 10 nm;

$Al_xGa_{(1-x)}As$ (x=0.48) carrier supplying layer 37 doped with Si to n-type, was epitaxial-grown by 30 nm;

$Al_xGa_{(1-x)}As$ (x=0.3) shotkey layer 38 was epitaxial-grown by 30 nm, and

GaAs contact layer 39 doped with Si to n-type, was epitaxial-grown by 600 nm, sequentially by MOVPE growth method. When each layer of the HEMT structure 51 was grown, the growth temperature was set to 580° C. or more and 750° C. or less. Further, the growth pressure was set to 6666 Pa (50 torr), and V/III ratio was set to 10 or more and 300 or less.

In this example, the $In_{(1-y)}Ga_yP$ layer (0.515≤y) with the band gap energy of 1.91 eV or more was grown on the GaAs contact layer 39 as the separation layer 40 for separating the HEMT structure 51 from the HBT structure 52. In order to grow the InGaP layer (separation layer 40) at a lower temperature than the aforementioned GaAs contact layer 39, a temperature interval is provided to the growth temperature of the InGaP layer (separation layer 40). In this example, after the GaAs contact layer having the HEMT structure 51 was grown, the temperature was decreased while flowing carrier gas and arsine, and a group V raw material was switched to phosphine from arsine, to thereby grow the InGaP layer. The growth temperature of the InGsP layer with the band gap energy of 1.91 eV or more, is varied by a circumstance of receiving the heat required for decomposing the source gas. Namely, although there is a dependency on apparatus, the band gap energy of 1.91 eV or more can be obtained when the temperature is set to about 550° C. or less. Accordingly, the growth temperature was set to 550° C. or less, and the growth pressure and the V/III ratio were set to the same as the condition of the HEMT structure 51.

After the InGaP layer (separation layer 40) was grown, phosphine was switched to arsine by raising the temperature while flowing the carrier gas and phosphine, to thereby sequentially grow on the separation layer 40:

GaAs sub-collector layer 41 doped with Si to n-type by 500 nm;

GaAs collector layer 42 doped with Si to n-type by 700 nm;

GaAs base layer 43 doped with C (carbon) to p-type by 120 nm;

InGaP emitter layer 44 doped with Si to n-type by 40 nm;

GaAs emitter contact layer 45 doped with Si to n-type by 100 nm, and $In_xGa_{(1-x)}As$ (0<x<1) non-alloy contact layer 46 doped with Si to n-type, as the HBT structure 52. When each layer of the HBT structure 52 was grown, the growth temperature was set to be lower than the growth temperature of the HEMT structure 51, and was set to 400° C. or more and 580° C. or less so that mobility of the HEMT structure 51 was not reduced. Further, the growth pressure was set to 6666 Pa (50 torr), and the V/III ratio was set to 0.5 or more and 300 or less. Wherein, the V/III ratio at the time of growing the sub-collector layer 41 and the collector layer 42 was set to 1 or more and 75 or less.

Example 2

The BiHEMT epitaxial wafer shown in FIG. 2 was manufactured. The separation layer 47 was formed as the $In_{(1-y)}Ga_yP$ layer (0.515>y), which was then grown at the same temperature as the temperature of the GaAs contact layer 39, and the band gap energy of the InGaP was set to less than 1.91 eV. The emitter layer 48 was formed as the $In_{(1-y)}Ga_yP$ layer (0.515≤y), which was then grown at a temperature of 550° C. or less. However, the growth temperature of the GaAs base layer 43 which is grown immediately before, is lower than 550° C. being the growth temperature of the InGaP emitter layer 48, and therefore interval of a temperature variation after growth of the GaAs base layer is a raised temperature period. The emitter layer 48 was grown at the growth temperature of 550° C. or less which is a higher temperature than the growth temperature of the base layer 43, and the band gap energy was set to 1.91 eV or more.

Note that even if the InGaP emitter layer 48 is grown at the same growth temperature as the base layer 43, the band gap energy is 1.91 eV or more, which is not practical because the n-type dopant is hardly decomposed at this temperature.

Example 3

The BiHEMT epitaxial wafer shown in FIG. 3 was manufactured. The same growth method of the InGaP emitter layer 48 as example 2 was used, to thereby manufacture other epitaxial layer including the separation layer 40, similarly to example 1. Thus, the band gap energy of both the separation layer 40 and the emitter layer 48 was set to 1.91 eV or more.

Comparative Example

The BiHEMT of a comparative example was manufactured similarly to example 1 excluding a point that the InGaP separation layer was grown at the same temperature as the GaAs contact layer, and the band gap energy of both the separation layer and the emitter layer was set to less than 1.91 eV.

(Evaluation)

Figure 6:
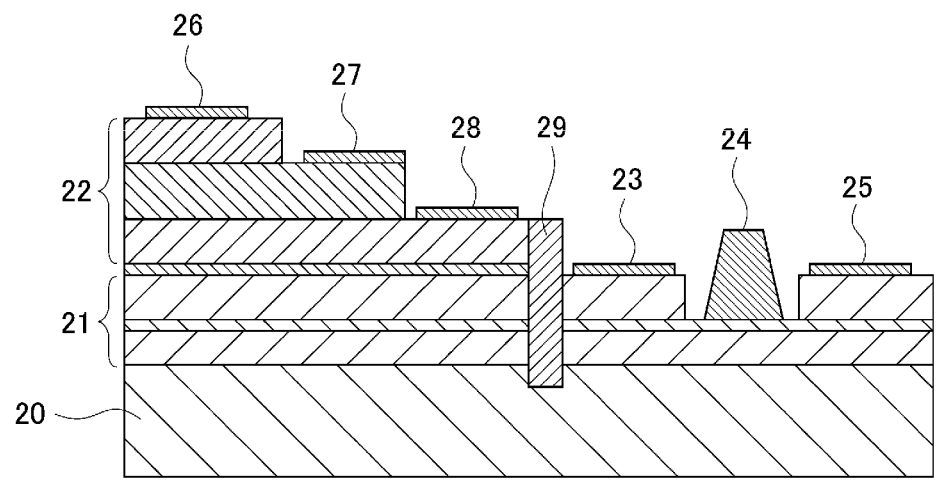
FIG. 6 is a schematic cross-sectional view of the transistor device fabricated using the epitaxial wafer.

The device using BiHEMT was completed by using the epitaxial wafer 50 for a transistor device having a thin film multilayer structure which is crystal-grown on the compound semiconductor substrate manufactured by the methods of examples 1, 2, 3, and comparative example, through a processing process such as pattern formation, etching, electrode formation, protective film formation, and packaging (see FIG. 6). When such a device is used for a transmission power amplifier, the device is operated at a low voltage, capable of suppressing a distortion of an output signal and reducing power consumption, and has a high mobility.

FIG. 4 shows an evaluation result of the reliability of the HBT structure 52 in BiHEMT. Standardized amplification factor β is taken on the vertical axis, and standardized energizing time is taken on the horizontal axis. The base current is adjusted so that emitter current of $1 \times 10^5$ A flows through an emitter area per square centimeters. Note that a measurement value is taken as an average of 20 values in each standardized one.

As is clarified from FIG. 4, regarding HBT manufactured by the method of the comparative example, drop of the current amplification factor is observed in a middle of the energizing time, and deterioration of the device occurs. Meanwhile, regarding HBT manufactured by the method of this example, variation of the current amplification factor was small even if the energizing time was elapsed to a certain degree in all examples 1, 2, 3. Particularly, the effect was great in example 3 in which this embodiment was applied to the device separation layer and the emitter layer, and in a range of the experiment performed this time, almost no deterioration of the amplification factor was observed.

As is described above, this is because effects such as improving steepness of the hetero interface, reducing a mixture of the impurities, and increasing ΔEv only in a case of being applied to the emitter of HBT, can be obtained by growing the InGaP layer at a lower temperature than conventional, and setting the band gap of the InGaP layer to 1.91 eV or more.

As described above, it was found that HBT device that constitutes the transistor device fabricated in examples 1 to 3, was capable of realizing the equivalent reliability to the reliability of the HBT device having a single body structure.

(Supplementary Description)

Preferable aspects of the present invention will be described hereafter.

<Supplementary Description 1>

There is provided a BiHEMT structure, which is composed of a compound semiconductor, having a multilayer structure (BiHEMT) in which HEMT and HBT are overlapped on the same substrate and epitaxial-grown thereon, wherein a band gap energy of an indium gallium phosphide layer (InGaP) included in an epitaxial layer, is set to 1.91 eV or more.

<Supplementary Description 2>

In the supplementary description 1, there is provided a BiHEMT structure wherein an InGaP layer included in the epitaxial layer is a separation layer for separating HEMT from HBT, and an emitter layer of HBT.

<Supplementary Description 3>

There is provided the BiHEMT structure according to the supplementary description 1, wherein the compound semiconductor is one or more compounds selected from a group consisting of GaAs, AlGaAs, InGaAs, InGaP, and InAlGaP.

<Supplementary Description 4>

There is provided the BiHEMT structure according to the supplementary description 3, wherein a lattice mismatch degree between the InGaP layer and the GaAs layer included in the epitaxial layer, is within ±500 s in an X-ray analysis measurement.

<Supplementary Description 5>

There is provided the BiHEMT structure according to the supplementary description 3, wherein a lattice mismatch

11 degree between the InGaP layer and the GaAs layer included in the epitaxial layer, is within ±200 s in an X-ray analysis measurement.

<Supplementary Description 6>
There is provided the BiHEMT structure according to the supplementary descriptions 4 and 5, wherein the InGaP layer included in the epitaxial layer is a separation layer for separating HEMT from HBT.

<Supplementary Description 7>
There is provided the BiHEMT structure according to the supplementary description 3, wherein n-type impurities are one or more elements selected from a group consisting of Si, Sn, S, Se, and Te.

<Supplementary Description 8>
There is provided the BiHEMT structure according to the supplementary description 7, wherein a lattice mismatch degree between the InGaP layer and the GaAs layer included in the epitaxial layer, is within ±500 s in an X-ray analysis measurement.

<Supplementary Description 9>
There is provided the BiHEMT structure according to the supplementary description 7, wherein a lattice mismatch degree between the InGaP layer and the GaAs layer included in the epitaxial layer, is within ±200 s in an X-ray analysis measurement.

<Supplementary Description 10>
There is provided the BiHEMT structure according to the supplementary description 8 or 9, wherein the InGaP layer included in the epitaxial layer is a separation layer for separating HEMT from HBT, and an emitter layer of HBT.

<Supplementary Description 11>
There is provided the BiHEMT structure according to the supplementary description 7, wherein P-type impurity is C (carbon).

<Supplementary Description 12>
There is provided the BiHEMT structure according to the supplementary description 11, wherein a lattice mismatch degree between the InGaP layer and the GaAs layer included in the epitaxial layer, is within ±500 s in an X-ray analysis measurement.

<Supplementary Description 13>
There is provided the BiHEMT structure according to the supplementary description 11, wherein a lattice mismatch degree between the InGaP layer and the GaAs layer included in the epitaxial layer, is within ±200 s in an X-ray analysis measurement.

<Supplementary Description 14>
There is provided the BiHEMT structure according to the supplementary description 12 or 13, wherein the InGaP layer included in the epitaxial layer is a separation layer for separating HEMT from HBT, and an emitter layer of HBT.

<Supplementary Description 15>
There is provided the BiHEMT structure according to the supplementary description 1, wherein the InGaP layer included in the epitaxial layer is an emitter layer of HBT.

<Supplementary Description 16>
There is provided the BiHEMT structure according to the supplementary description 15, wherein a compound semiconductor is one or more compounds selected from a group consisting of GaAs, AlGaAs, InGaAs, InGaP, and InAlGaP.

<Supplementary Description 17>
There is provided the BiHEMT structure according to the supplementary description 16, wherein N-type impurities are one or more elements selected from a group consisting of Si, Sn, S, Se, and Te.

12

<Supplementary Description 18>
There is provided the BiHEMT structure according to the supplementary description 17, wherein a lattice mismatch degree between the InGaP layer and the GaAs layer included in the epitaxial layer, is within ±500 s in an X-ray analysis measurement.

<Supplementary Description 19>
There is provided the BiHEMT structure according to the supplementary description 17, wherein a lattice mismatch degree between the InGaP layer and the GaAs layer included in the epitaxial layer, is within ±200 s in an X-ray analysis measurement.

<Supplementary Description 20>
There is provided the BiHEMT structure according to the supplementary description 18 or 19, wherein C (carbon) is used for doping a base layer of HBT.

What is claimed is:

1. A transistor device, having a multilayer structure in which a high electron mobility transistor and a heterojunction bipolar transistor, which are composed of a compound semiconductor, are overlapped on the same substrate and epitaxial-grown thereon,
wherein
the multilayer structure contains an $In_{(1-y)}Ga_yP$ layer ($0.515 \leq y < 1$) as an epitaxial layer, and
a band gap energy of the $In_{(1-y)}Ga_yP$ layer ($0.515 \leq y < 1$) is set to 1.91 eV or more.

2. The transistor device according to claim 1, wherein the $In_{(1-y)}Ga_yP$ layer is a separation layer for separating the high electron mobility transistor from the heterojunction bipolar transistor.

3. The transistor device according to claim 1, wherein the $In_{(1-y)}Ga_yP$ layer is an emitter layer of the heterojunction bipolar transistor.

4. The transistor device according to claim 1, wherein the $In_{(1-y)}Ga_yP$ layer is a separation layer for separating the high electron mobility transistor from the heterojunction bipolar transistor, and an emitter layer of the heterojunction bipolar transistor.

5. The transistor device according to claim 1, wherein the compound semiconductor is one or more compounds selected from a group consisting of GaAs, AlGaAs, InGaAs, InGaP, and InAlGaP.

6. The transistor device according to claim 2, wherein the compound semiconductor is one or more compounds selected from a group consisting of GaAs, AlGaAs, InGaAs, InGaP, and InAlGaP.

7. The transistor device according to claim 3, wherein the compound semiconductor is one or more compounds selected from a group consisting of GaAs, AlGaAs, InGaAs, InGaP, and InAlGaP.

8. The transistor device according to claim 4, wherein the compound semiconductor is one or more compounds selected from a group consisting of GaAs, AlGaAs, InGaAs, InGaP, and InAlGaP.

9. The transistor device according to claim 5, wherein the multilayer structure includes a layer doped with n-type impurities as the epitaxial layer, and the n-type impurities are one or more elements selected from a group consisting of Si, Sn, S, Se, and Te.

10. The transistor device according to claim 6, wherein the multilayer structure includes a layer doped with n-type impurities as the epitaxial layer, and the n-type impurities are one or more elements selected from a group consisting of Si, Sn, S, Se, and Te.

11. The transistor device according to claim 7, wherein the multilayer structure includes a layer doped with n-type impurities as the epitaxial layer, and the n-type impurities are one or more elements selected from a group consisting of Si, Sn, S, Se, and Te.

12. The transistor device according to claim 8, wherein the multilayer structure includes a layer doped with n-type impurities as the epitaxial layer, and the n-type impurities are one or more elements selected from a group consisting of Si, Sn, S, Se, and Te.

13. The transistor device according to claim 9, wherein the multilayer structure includes a layer doped with a p-type impurity as the epitaxial layer, and the P-type impurity is C (carbon).

14. The transistor device according to claim 10, wherein the multilayer structure includes a layer doped with a p-type impurity as the epitaxial layer, and the P-type impurity is C (carbon).

15. The transistor device according to claim 11, wherein the multilayer structure includes a layer doped with a p-type impurity as the epitaxial layer, and the P-type impurity is C (carbon).

16. The transistor device according to claim 12, wherein the multilayer structure includes a layer doped with a p-type impurity as the epitaxial layer, and the P-type impurity is C (carbon).

17. The transistor device according to claim 5, wherein the multilayer structure further includes a GaAs layer as the epitaxial layer and a lattice mismatch degree between the $In_{(1-y)}Ga_yP$ layer and the GaAs layer is within ±500 s in an X-ray analysis measurement.

18. The transistor device according to claim 6, wherein the multilayer structure further includes a GaAs layer as the epitaxial layer and a lattice mismatch degree between the $In_{(1-y)}Ga_yP$ layer and the GaAs layer is within ±500 s in an X-ray analysis measurement.

19. The transistor device according to claim 7, wherein the multilayer structure further includes a GaAs layer as the epitaxial layer and a lattice mismatch degree between the $In_{(1-y)}Ga_yP$ layer and the GaAs layer is within ±500 s in an X-ray analysis measurement.

20. A method of manufacturing a transistor device, comprising:
    forming a high electron mobile transistor composed of a compound semiconductor on a substrate;
    forming an $In_{(1-y)}Ga_yP$ layer ($0.515 \leq y < 1$) on the high electron mobile transistor at a temperature of allowing a band gap energy to be set to 1.91 eV or more; and
    forming a hetero bipolar transistor composed of the compound semiconductor on the $In_{(1-y)}Ga_yP$ layer.

* * * * *